United States Patent [19]

Chiang

[11] Patent Number: 5,555,200
[45] Date of Patent: Sep. 10, 1996

[54] CHARGE DOMAIN BIT-SERIAL MULTIPLYING DIGITAL-ANALOG CONVERTER

[75] Inventor: Alice M. Chiang, Weston, Mass.

[73] Assignee: Massachusetts Institute of Technology, Cambridge, Mass.

[21] Appl. No.: 457,827

[22] Filed: Jun. 1, 1995

Related U.S. Application Data

[62] Division of Ser. No. 388,170, Feb. 10, 1995, which is a continuation of Ser. No. 49,707, Apr. 20, 1993, abandoned.

[51] Int. Cl.⁶ .................................................. G06J 1/00
[52] U.S. Cl. ................................................... 364/606
[58] Field of Search ................................. 364/606, 602, 364/825

[56] References Cited

U.S. PATENT DOCUMENTS

| | | |
|---|---|---|
| 4,149,259 | 4/1979 | Kowalski . |
| 4,234,930 | 11/1980 | Campbell . |
| 4,464,726 | 8/1984 | Chiang . |
| 4,489,309 | 12/1984 | Schlig . |
| 4,605,826 | 8/1986 | Kanemasa . |
| 4,654,815 | 3/1987 | Marin et al. ........................ 364/606 |
| 4,696,015 | 9/1987 | Palicot et al. . |
| 4,771,396 | 9/1988 | South et al. . |
| 4,862,402 | 8/1989 | Shah et al. . |
| 4,947,362 | 8/1990 | Bui . |
| 4,947,363 | 8/1990 | Williams . |
| 5,045,945 | 9/1991 | Herman et al. . |
| 5,050,186 | 9/1991 | Gurcan et al. . |
| 5,111,419 | 5/1992 | Morley, Jr. et al. . |
| 5,168,459 | 12/1992 | Hiller . |
| 5,309,378 | 5/1994 | Beierle . |
| 5,313,411 | 5/1994 | Tsujimoto . |
| 5,327,459 | 7/1994 | Hara et al. . |
| 5,353,244 | 10/1994 | Peters et al. ......................... 364/602 |

OTHER PUBLICATIONS

Ahuja, Bhupendra K., Miles A. Copeland, and Chong Hon Chan, "A Sampled Analog MOS LSI Adaptive Filter", *IEEE Transactions on Communications*, vol. Com–27, No. 2, Feb. 1979, pp. 406–412.

*Primary Examiner*—Tan V. Mai
*Attorney, Agent, or Firm*—Samuels, Gauthier, Stevens & Reppert

[57] ABSTRACT

A single chip adaptive filtering system including an FIR filter and circuitry for calculating updated weighting coefficients for use in associated multiplying digital-to-analog converters. The adaptive FIR filter performs the convolution of a delayed and sampled input sequence to produce a filter output. Thereafter, an error term is determined by calculating the difference between the filter output and a reference signal which corresponds to a predetermined anticipated output of the filter. The error term is then applied to a least mean square (LMS) estimation algorithm for computing updated weighting coefficients to be used by the adaptive FIR filter.

8 Claims, 4 Drawing Sheets

CHARGE DOMAIN BIT-SERIAL MULTIPLYING DIGITAL-ANALOG CONVERTER

This invention was made with Government support under Contract Number F19628-90-C-0002 awarded by the Air Force. The Government has certain rights in the invention.

This is a divisional of copending application Ser. No. 08/388,170 filed on Feb. 10, 1995, which is a file wrapper continuation of Ser. No. 08/049,707, filed Apr. 20, 1993, abandoned.

BACKGROUND OF THE INVENTION

The invention is directed to a single chip adaptive filter which utilizes updatable filter weights.

In many communication, control or terrestrial/cable television transmission systems, received input :signals often consist of the sum of a desired signal and an undesired noise or interference. A signal processor is required to estimate or recover the desired signal in the presence of the additive interference noise. Significant research efforts have been dedicated toward this type of signal estimation problem. One conventional approach for solving these problems includes the use of an adaptive finite-impulse (FIR) filter which removes the interference and produces an output that approximates the desired signal. The filter weights required to achieve the optimum performance can be determined from a least mean square (LMS) algorithm based on a gradient optimization. Applications for real-time adaptive filtering techniques are in such diverse fields as adaptive control, ghost cancellation in terrestrial and cable TV transmission, channel equalization for communication and magnetic recording, estimation/prediction for speech processing, adaptive noise cancellation in electrocardiogram, etc.

The predominant hardware challenges for implementation of such filtering devices are the development of processors capable of providing a large number of computations with low power consumption and low cost production. The computations required are divided between those carried out for the realization of the FIR filter, e.g. requiring the repetitive calculation of a sum of products, and those calculations for the adaptation of the filter, e.g. requiring a large number of multiplication steps and simple IIR (Infinite Impulse Response) filters.

An important example of a specific application requiring massive computations at low cost is the problem related to ghost cancellation in television systems. Several attempts have been made for standardizing ghost cancellation systems, all of which are generally similar to one another as discussed in Tawil et al., "Field Testing of a Ghost Canceling System for NTSC Television Broadcasting", IEEE trans. on Broadcasting volume 36, no. 4, pages 255–261, 1990. A standard reference would be incorporated into the transmitted signal at predictable time intervals. The received signal, distorted by multipath transmission, would be passed through an adaptive FIR filter and at the predictable time intervals when the references known to be present, the weights of the filter would be adapted so that the actual output comes to closely resemble the standard reference. At the times when the reference is not present, the adaptation would stop, but the FIR filter would continue to filter the signal to suppress the multipath interference.

The ghost canceling application requires adaptive FIR filtering which utilizes at least a few hundred taps. Using conventional digital circuits, a ghost canceler would have to be a multi-chip system. For example, a block diagram of a ghost cancellation system 10 which is conventionally utilized for terrestrial and cable TV transmission is shown in FIG. 1. An analog base band video input signal from input signal source 11 is passed through an analog-to-digital converter 12 for conversion to a digital signal. The input signal is also provided to a synchronization circuit 13 for extracting synchronization signals and phase-locked sample clock signals. The digital video signal is then fed to a digital FIR filter 14 which utilizes electrically programmable filter coefficients. The digital video signal is also provided to a DSP processor 15 which examines a captured single line or "training signal" which is known to contain the reference signal. The DSP processor carries out an adaptation algorithm stored in ROM/RAM memory 16 in order to calculate the filter coefficients necessary to cancel any imperfections in the channel. The filter coefficients are then downloaded to the FIR filter 14, which in turn performs the filtering operation on the rest of the video signal. The output of the FIR filter is fed to a video rate D/A converter 17 for producing the output signal 18 which is supplied to the video signal receiver. This type of system inherently requires an expensive multi-chip configuration, however, due to the fact that ghost cancellation systems will ideally be provided in many television receivers, an inexpensive realization for carrying out the same filtering function is very desirable.

SUMMARY OF THE INVENTION

The present invention is a charge domain bit-serial multiplying digital-analog converter including a plurality of pipelined processing stages. Each of the processing stages includes an analog input for receiving an analog input signal and a digital input for receiving a digital input signal. A dividing circuit is operable for receiving the analog signal and dividing it into first and second equal portions. A first output unit receives the first equal portion as a magnitude product of the analog and digital input signals in response to the digital signal having a first digital value. A second output unit receives the first equal portion in response to the digital signal having a second digital value or the second equal portion in response to the digital signal having the first digital value.

DETAILED DESCRIPTION OF THE ILLUSTRATED EMBODIMENTS

Figure 1:
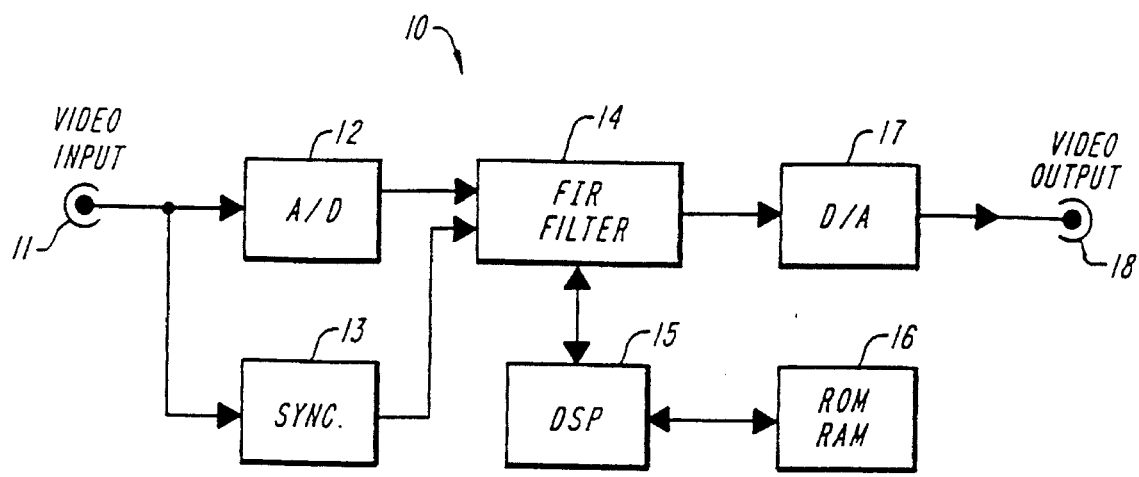
FIG. 1 shows a block diagram of a prior art ghost cancellation/adaptive filtering system.
Figure 2:
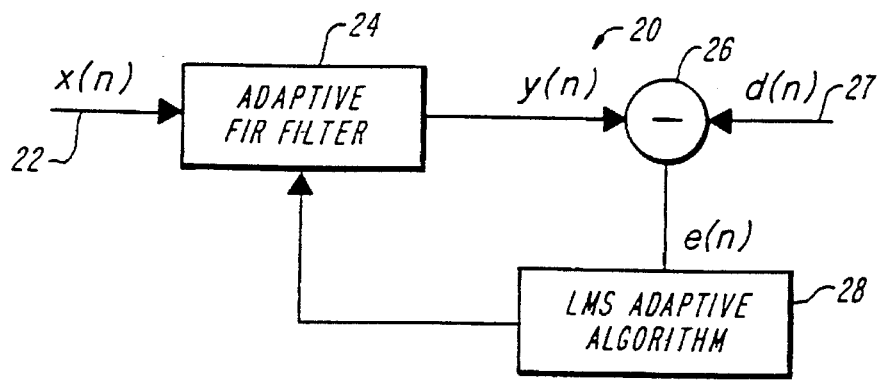
FIG. 2 shows a block diagram of the single chip adaptive filter in accordance with the present invention.

With reference now to FIG. 2, a block diagram of the single chip adaptive filtering system 20 in accordance with the present invention is shown. In the system 20, a sampled input sequence x(n) is provided to an adaptive FIR filter section 24 which performs the convolution of the sampled input sequence to produce the filter output y(n). Thereafter, an error term $\epsilon(n)$ is determined by calculating the difference between the filter output $y(n)$ and a reference signal $d(n)$, which corresponds to a predetermined anticipated output of the filter, from a reference signal source 27 by a comparator/differencing circuit 26. The error term $\epsilon(n)$ is then applied to a least mean square (LMS) estimation algorithm for computing updated weighting coefficients to be used by the adaptive FIR filter 24.

In the filtering system 20 of the present invention which utilizes an FIR filter with N taps, a least mean square (LMS) estimation technique is used for the weight update computation. Specifically, for a sampled input sequence $x(n)$, the system computes the output $$y(n) = \sum_{k=0}^{N-1} x(n-k) w_k(n) \quad (1)$$

and thereafter the weights $w_k(n)$ are also updated using the LMS algorithm. Preferably, the system uses an N-stage adaptive FIR with adjustable weight $w_k(n)$ for tap k at the nth sampling instant and N parallel processing elements which each compute the weight update of each tap according to the LMS algorithm.

Ideally, the filter output $y(n)$ will be equal to the reference $d(n)$, otherwise an error signal is formed:

$$\epsilon(n) = d(n) - y(n) = d(n) - \sum_k x(n-k) w_k(n) \quad (2)$$

Thereafter, the error power is minimized according to the following:

$$E = \sum_n [d(n) - y(n)]^2 = \sum_n \epsilon(n) \left[ d(n) - \sum_k w_k x(n-k) \right] \quad (3)$$

Since E depends on each weight $w_k$, a prediction may be made as to how E varies if the adjustable weighting coefficient $w_k$ is varied. The variation in E would be proportional to $\partial$ of $E/\partial$ of $w_k$ which is as follows:

$$\frac{\partial E}{\partial w_k} = -\sum_n \epsilon(n) x(n-k) \quad (4)$$

However, in the LMS algorithm the components of the gradient are estimated using only the instantaneous term $$\xi\left(\frac{\partial E}{\partial w_k}\right) = -\epsilon(n)x(n-k) \quad (5)$$

and each weight $w_k(n)$ is updated by an amount proportional to $\xi(\partial E/\partial w_k)$, but oppositely directed as:

$$w_k(n+1) = w_k(n) + \mu\epsilon(n)x(n-k) \quad (6)$$

where $\mu$ is a constant which determines the stability and the convergence rate of the iterative process.

According to an alternate variation of the algorithm, the weights $w_k(n)$ are not updated every iteration, but only every pth iteration, using a better approximation of the gradient.

$$\xi\left(\frac{\partial E}{\partial w_k}\right) = -\sum_{i=0}^{p-1} \epsilon(n-i)x(n-i-k) \quad (7)$$

and hence $$w_k(n+p) = w_k(n) + \Delta_k \quad (8)$$

$$\Delta k = \mu \sum_{i=0}^{p-1} \epsilon(n-i)x(n-i-k) \quad (9)$$

Based on the derivations provided, the implementation of an adaptive FIR filter with the use of an LMS algorithm requires two calculations. The first calculation involves a computation of the error signal, $\epsilon(n)$ according to Equation (2) and thereafter computing the updated filter weight $w_k(n+p)$ according to Equations (8) and (9). As can be derived from Equation (2), in order to calculate the error term $\epsilon(n)$, initially a FIR filter is needed to perform the convolution of the input sequence, $x(n)$, with the tap weights $w_k$, and thereafter a computation is needed to provide the difference between the filter output and the anticipated output $d(n)$. For the weight updating calculation, a parallel pipelined architecture is preferably used, in which each weight update term $\Delta_k$ is computed with a multiplier followed by an accumulator, thus multiplying the error term $\epsilon(n)$ by a properly delayed input and then accumulating the products for p iterations.

Figure 3:
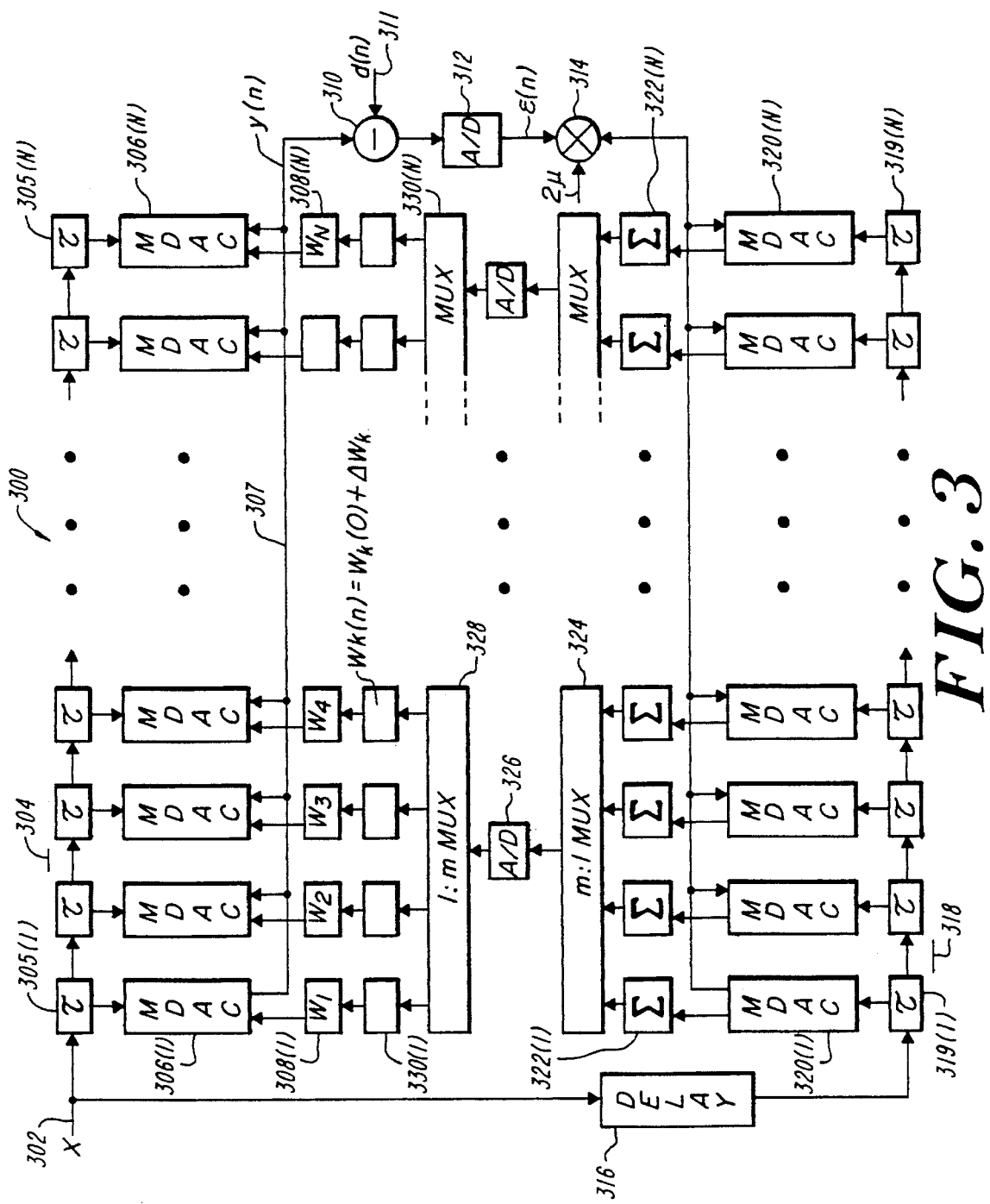
FIG. 3 shows a more detailed block diagram of the single chip adaptive filter of the present invention.

With reference now to FIG. 3, one embodiment of the adaptive filtering system 300 in accordance with the present invention is shown for use with analog input signals and digital weighting coefficients. Initially, an analog signal is provided from an input signal source 302 to a N-stage tapped delayed line 304 having N number of memory modules 305(1) through 305(N) for starting the convolution/correlation operation. For charge domain applications, the tapped delay line is a charge-transfer device such as a charge-coupled device (CCD) shift register, and therefore the memory modules 305 are implemented as sensing floating gates. Accordingly, a succession of discrete charge samples from the input sequence $x(n)$, which are linearly related to the sampled input voltage, are propagated down the tapped delay line 304 in a shift and hold sequence. As a charge packet moves into a potential well beneath one of the sensing floating gates, a charge is induced on each gate segment which is proportional to the input signal $x(n)$.

Each of the memory modules 305(1)–305(N) is coupled to the analog input of an associated one of digital-analog multiplying devices 306(1) through 306(N). The digital inputs to the multipliers are supplied with updatable weighting coefficients from digital memory modules 308(1) through 308(N). The output from each multiplier is a charge packet which is proportional to the product of the analog potential at the analog input gate from the sensing floating gate and the digital signal at the digital input. All of the multipliers have a common output node 307, which functions as a device for summing the charge packets applied thereto by the multipliers. The output from the multiplying stage is an analog quantity in the sum of the product operation $$\sum_{k=0}^{N} x(n-k)w_k(n) \quad (10)$$

which is performed in analog form.

The multiplying devices 306(1)–306(N) are preferably multiplying digital-to-analog converters (MDAC). Each MDAC has M-bit accuracy, with one analog input, M-parallel digital inputs, and one analog output.

Figure 4:
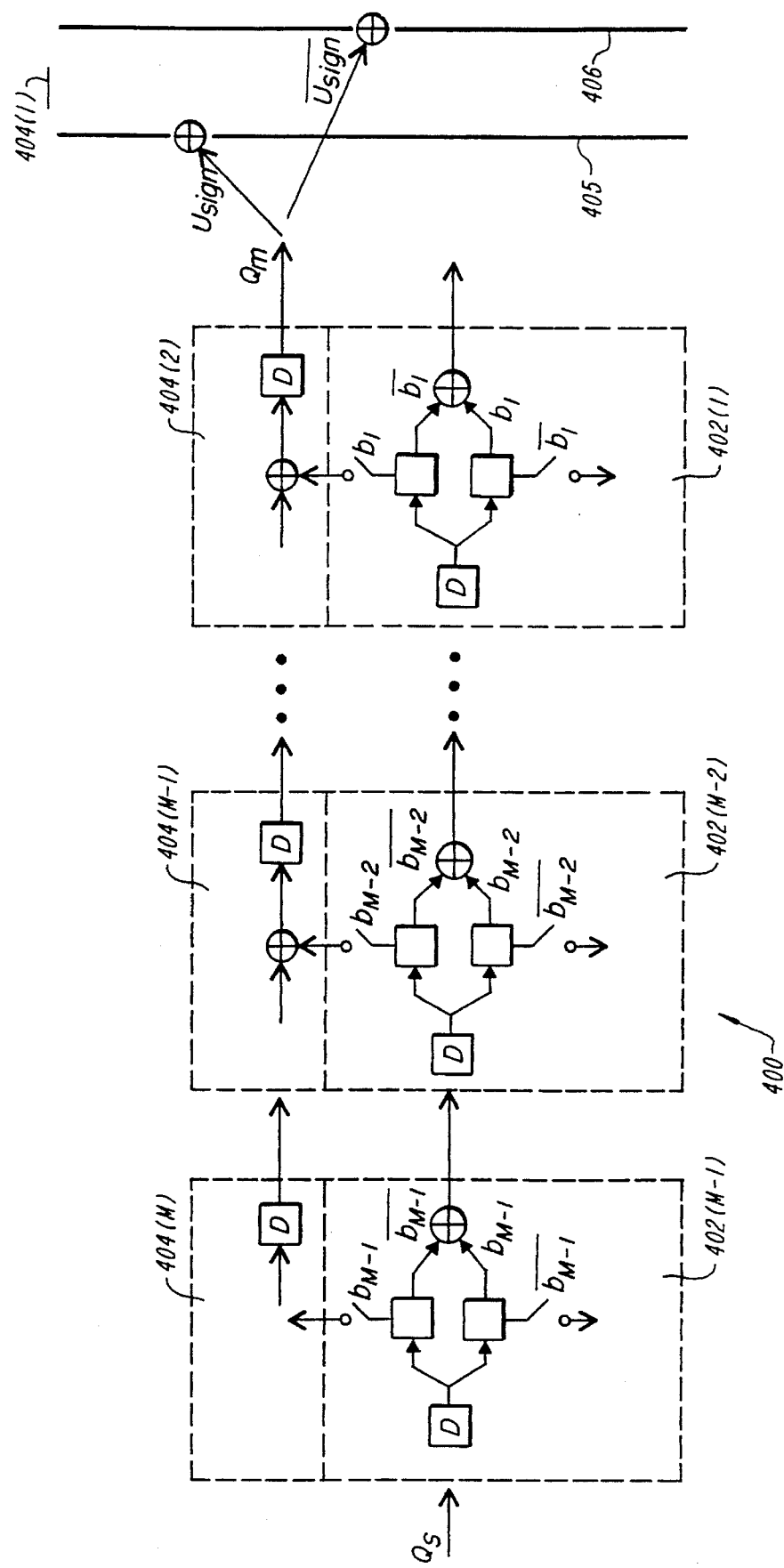
FIG. 4 shows a detailed block diagram of a bit serial pipelined multiplying digital-to-analog converter.

According to a preferred embodiment of the present invention, a bit-serial, pipelined multiplying digital-to-analog converter 400 is utilized as shown in FIG. 4. The bit-serial pipelined MDAC can be used to compute the product of a bipolar analog quantity with a M-bit digital word in signed-magnitude representation.

In such a direct-multiplication digital multiplier for numbers in signed-magnitude representation, the multiplicand, A, is a L-bit word and the multiplier, B, is a M-bit word as shown below $$A = a_L + \sum_{i=1}^{L-1} a_{L-i} 2^{-i} = a_L + A^* \quad (11)$$

$$B = b_M + \sum_{i=1}^{M-1} b_{M-i} 2^{-i} = b_M + B^* \quad (12)$$

where $a_i$ and $b_i$ are either 0 or 1. $A^*$ and $B^*$ represent the number bits. $a_L$ and $b_M$ are the sign bits, 0 and 1 representing, respectively, the positive and negative sign. Letting the product be the number U, the result is $$U = AB = u_{sign} + A^*B^* = u_{sign} + A^*b_{M-1}2^{-1} + A^*b_{M-2}2^{-2} + \ldots + A^*b_1 2^{-(M-1)} \quad (13)$$

Since the $b_i$'s are merely 0 or 1, the binary multiplication is merely repeated addition operations, with the multiplicand properly shifted. The sign digit of the product $u_{sign}$ is the XOR of the sign bits $a_L$ and $b_M$.

In a charge-domain bit-serial pipelined implementation of the direct multiplication, the bipolar analog multiplicand A is represented by an analog charge packet $Q_S$ and a sign bit. If the input is a 10-bit word plus a sign word, the charge packet will represent the 10-bit value. To calculate the magnitude product of $Q_S B^*$ as in the above Equation (13), only dividing the charge by two and addition operations are required. The M-bit multiplier is represented by two's complement notation, i.e.

$$\sum_{i=1}^{M-1} 2^{-i} b_{M-i} \quad (14)$$

plus a sign bit $b_M$.

As shown in FIG. 4, the multiplier 400 includes M−1 delay and divide-by-two circuits 402(1) through 402(N−1), and a M-stage output summing-and-delay buffer 404(1) through 404(M). During the first clock period, the input analog charge packet $Q_S$ is divided into two identical parts, each one represented by $Q_S/2$. The processing path of one of the charge portions is controlled by the value of $b_{M-1}$, and the other half is always transferred to the next divide-by-two stage. For example, if $b_{M-1}=1$, a charge packet equaling to $Q_S/2$ will be transferred to the output summing buffer located at the top of the multiplier and the other charge packet will be transferred to the next delay and divide-by-two circuit. On the other hand, if $b_{M-1}=0$, a charge packet equal to $Q_S/2$ will be discarded to an output drain, while the other half will be transferred to the next delay and divide-by-two circuit.

As shown in FIG. 4, the charge transfer is controlled by both $b_i$ and its complement $\bar{b}_i$. If $b_i$ is 1, the gate connected to this bit is then on, if $b_i$ is 0, the gate is off. For example, if $b_i$ is 1, then $\bar{b}_i$ is 0, it follows then that the gate connected to the output buffer is on, and the gate connected to the output drain is off. There are two gates controlling the charge packet transferred to the next delay stage: one gate is controlled by $b_i$ and the other by $\bar{b}_i$. No matter what the value of $b_i$, one gate is always open. Therefore, one half of the charge will always be transferred to the next delay stage.

During the next clock period, the same operation repeats in the subsequent stages. Outputs of the subsequent divide-by-two circuit will be two charge packets, each portion equalling to $Q_S/4$. Again, one charge packet is transferred to the next delay stage, while the other charge packet will either be transferred to the second stage of the output summing-and-delay buffer 404 and summed with the charges generated from the previous bit, or it will be discarded, depending on the value of $b_{M-1}$. It follows then, after two stages, the amount of charge in the second stage of the output buffer will equal to $$\sum_{i=1}^{2} Q_s 2^{-i} b_{M-i} \quad (15)$$

Which represents the first two partial product terms shown in Equation (13). These divide-by-two and summing operations repeat for M−1 clocks. The amount of charge in the output buffer will then equal to $$\sum_{i=1}^{M-1} Q_s 2^{-i} b_{M-i} \quad (16)$$

which is the desired output representing the magnitude product of an analog quantity with a digital quantity.

As can be derived from the above description, the multiplier is implemented in a pipelined fashion, a new input-charge packet $Q_S$ can be applied to the multiplier at every clock. After an initial latency time of M−1 clocks, the multiplier 400 will have a continuous throughput rate equal to the input data rate.

In order to compute the final four-quadrant output, the most significant bit of the digital word will be XORed with the sign bit of the analog input. This will generate a control signal for the sign bit, $u_{sign}$, of the final product. If the control signal is "1", the charge packet will be transferred to the positive sum-of-the-product node 405, and if equal to "0" it will be transferred to the negative node 406.

Returning now to FIG. 3, the weighting coefficient update computation is described hereinafter. Initially, the input sequence x(n) is provided to a second analog tapped delay line 318 after being delayed a predetermined amount by a delay circuit 316. The delay circuit 316 is provided to compensate for latency timing errors in the filter system elements.

The tapped delay line 318 operates to shift and hold the input sequence along memory modules 319(1) through 319(N). At each memory module of the tapped delay line, the discrete samples of the input sequence are non-destructively sensed and applied to the analog inputs of corresponding multiplying devices 320(1) through 320(N). The digital inputs of the multiplying devices are provided with a digital representation of an error term $\epsilon(n)$, the derivation of which is as follows.

The summed output of y(n) of the multiplying devices 306(1)–306(N) is applied to a comparator/differencing circuit 310, which operates to compare the output y(n) with the reference signal d(n) from the reference signal source 311. If there are any differences between these signals, the error signal $\epsilon(n)$ is produced and converted to a digital signal by A/D converter 312. A multiplier 314 receives the error signal and multiplies it with a convergence factor $2\mu$. Accordingly, at any predetermined time, all of the multiplying devices 320(1)–320(N) receive the same weighted error signal.

The output of each multiplying device is an analog quantity which is summed in corresponding accumulator circuits 322(1)–322(N) for p clock periods as indicated by Equation (9). After p clock periods, the information stored in each accumulator circuit 322(1)–322(N) represents the desired weighting coefficient update value $\Delta w_k$ for the corresponding filter weight. The weight update values are passed through a m:1 MUX 324, an A/D converter 326, and a 1:m MUX 328 for conversion to a digital representation of the weight update. The weight updates are then applied to updated weighting coefficient digital memory circuits 330(1)–330(N) which operate to combine the weight update with the previously stored weighting coefficient so as to generate the updated weighting coefficient.

Figure 5:
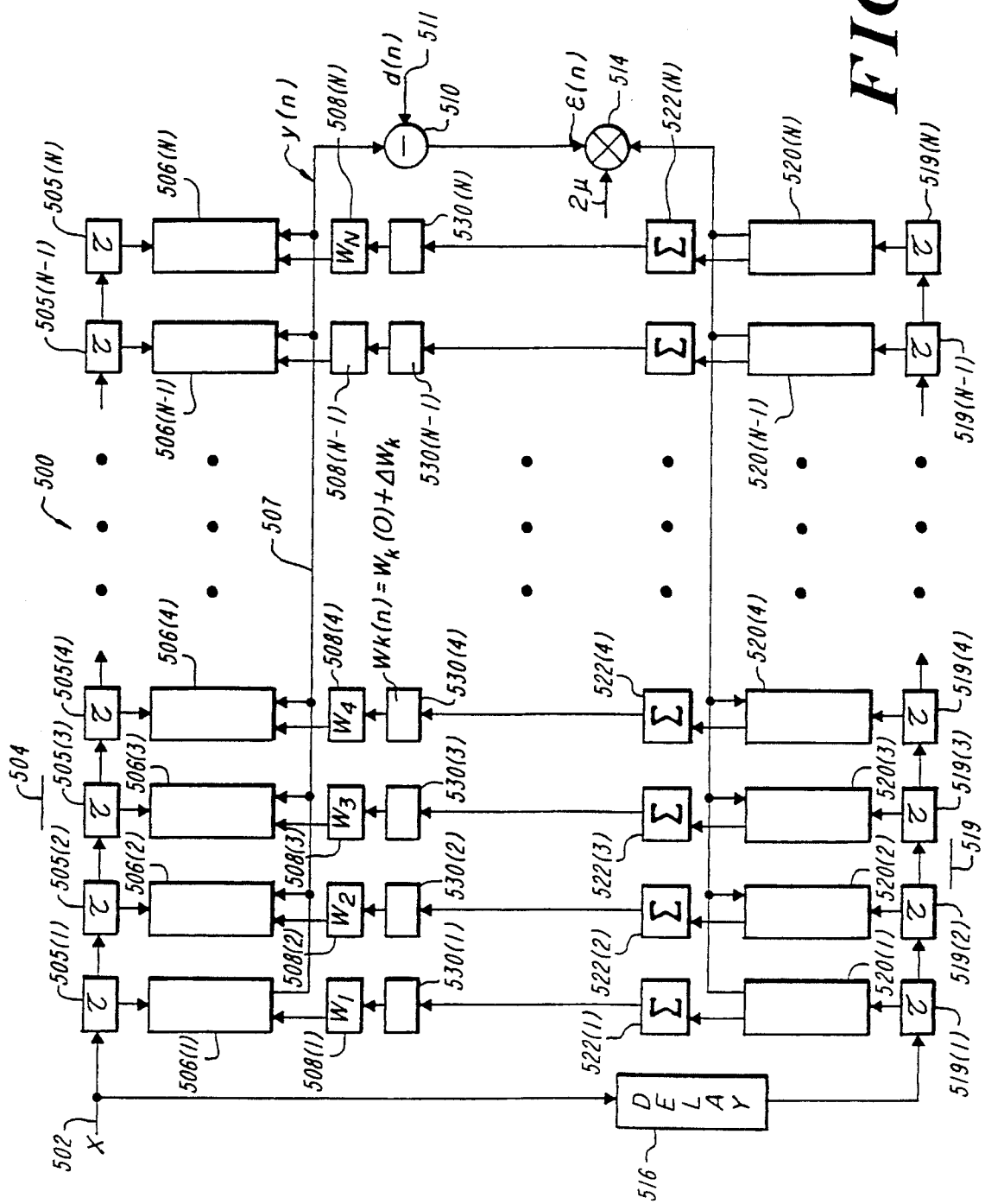
FIG. 5 shows a detailed block diagram of an alternate embodiment of the single chip adaptive filter of the present invention.

According to an alternative embodiment of the present invention, a single chip adaptive filter 500 which utilizes a digital input sequence x(n) and analog weighting coefficients is shown in FIG. 5. In this implementation, the system 500 utilizes many of the same components as the system 300 illustrated in FIG. 3. The system 500, however, utilizes M digital tapped delay lines, each having memory modules 505(1)–505(N), where M represents the accuracy of the input word x(n). The tapped delay line is preferably a charge domain digital shift register which is used to shift and hold the input sequence x(n) from the input signal source 502. At each stage of the tapped delay line, the M-bit digital word is applied in parallel to its corresponding multiplying device 506(1)–506(N). The filter weighting coefficients are stored in analog form in associated analog memory circuits 508(1)–508(N). The multiplying devices are used to compute in parallel the products of the discrete samples of the input sequence with its corresponding filter weight. The output from each multiplying device is an analog quantity representative of the sum of the products generated by the multiplying devices.

The weight update computation is performed by the use of a delay circuit 516, digital tapped delay lines 519, multiplying devices 520(1)–520(N) and summation circuits 522(1)–522(N). The tapped delay line is used to hold and shift the delayed input sequence such that at each stage of the delay, digital inputs are applied to corresponding multiplying devices. The multiplying devices also receive the weighted analog error signal $\epsilon(n)$, and produce an analog output which is summed and a corresponding accumulator circuit for p clock periods. After p clock periods, the information stored in each accumulator circuit represents the desired weight update for the corresponding filter weight. Each weight update is combined in updated weighting coefficient analog memory circuits 530(1)–530(N) in analog form with the previously stored weighting coefficient so as to generate a new filter weight as required in Equations (8) and (9).

What is claimed is:

1. A charge domain bit-serial multiplying digital-analog converter including a plurality of pipelined processing stages, each of said processing stages comprising:

an analog input for receiving an analog input signal;

a digital input for receiving a digital input signal;

a dividing circuit operable for receiving said analog signal and dividing it into first and second equal portions;

a first output unit which receives a magnitude product of said first equal portion of said analog input signal and said digital input signal in response to said digital signal having a first digital value; and a second output unit which receives said first equal portion in response to said digital signal having a second digital value or said second equal portion in response to said digital signal having said first digital value.

2. The multiplier of claim 1 further comprising switching circuitry associated with said dividing circuit operable for switching said first and second portions to said first and second output units in accordance with the digital value of said digital signal.

3. The multiplier of claim 1, wherein said first output unit comprises a summing buffer which receives and sums values from first output units of previous stages and said first equal portion and outputs same to the summing buffer of a subsequent stage as a magnitude product of said analog input signal and said digital input signal.

4. The multiplier of claim 1, wherein said second output unit is coupled to the analog input of a subsequent processing stage.

5. The multiplier of claim 1, wherein said second portion of said analog input signal is discarded in response to said digital signal having said second digital value.

6. The multiplier of claim 1, wherein said first output unit outputs a magnitude product of said analog and digital input signals to either a positive sum-of-the-product node or a negative sum-of-the-product node in accordance with a control signal.

7. The multiplier of claim 6, wherein said control signal comprises the XOR result of the most significant bit of said digital input signal and a sign bit associated with said analog input signal.

8. A method of processing in a bit-serial multiplying digital-analog converter having a plurality of pipelined processing stages, said method comprising the steps of:

receiving an analog input signal;

receiving a digital input signal;

dividing said analog input signal into first and second equal portions;

transferring said first equal portion to a first output unit in response to said digital signal having a first digital value;

transferring said first equal portion to a second output unit in response to said digital signal having a second digital value or transferring said second equal portion to said second output unit in response to said digital signal having said first digital value;

outputting said first or second equal portions from said second output unit to a subsequent processing stage;

summing said first equal portion of said analog input signal with values received from first output units from previous stages so as to produce a magnitude product of said analog and digital input signals.

* * * * *